United States Patent [19]
Shimanuki et al.

[11] Patent Number: 6,071,341
[45] Date of Patent: Jun. 6, 2000

[54] APPARATUS FOR FABRICATING SINGLE-CRYSTAL SILICON

[75] Inventors: Yoshiyuki Shimanuki; Toshimichi Kubota; Toshirou Kotooka; Makoto Kamogawa, all of Hiratsuka, Japan

[73] Assignee: Komatsu Electronic Metals Co., Ltd., Kanagawa, Japan

[21] Appl. No.: 08/861,340

[22] Filed: May 21, 1997

[30] Foreign Application Priority Data

May 22, 1996 [JP] Japan ................................. 8-150289

[51] Int. Cl.⁷ .................................................. C30B 15/14
[52] U.S. Cl. ...................... 117/208; 117/201; 117/217; 117/218; 117/932
[58] Field of Search ................................. 117/208, 932, 117/201, 217, 218

[56] References Cited

U.S. PATENT DOCUMENTS

| | | | |
|---|---|---|---|
| 4,956,153 | 9/1990 | Yamagishi | 117/932 |
| 5,260,037 | 11/1993 | Kitaura | 117/932 |
| 5,316,742 | 5/1994 | Tomioka | 117/932 |
| 5,441,014 | 8/1995 | Tomioka | 117/208 |
| 5,443,034 | 8/1995 | Everts | 117/13 |

FOREIGN PATENT DOCUMENTS

| | | | |
|---|---|---|---|
| 3-279290 | 12/1991 | Japan | 117/217 |
| 05194076 | 8/1993 | Japan . | |
| 06144986 | 5/1994 | Japan . | |
| 06211591 | 8/1994 | Japan . | |
| 06211592 | 8/1994 | Japan . | |
| 06219886 | 8/1994 | Japan . | |
| 06279169 | 10/1994 | Japan . | |
| 06287098 | 10/1994 | Japan . | |
| 07172971 | 7/1995 | Japan . | |
| 2139918 | 11/1984 | United Kingdom | 117/217 |

Primary Examiner—Robert Kunemund
Attorney, Agent, or Firm—Welsh & Katz, Ltd.

[57] ABSTRACT

An apparatus for fabricating single-crystal silicon easily controlling a temperature gradient based on the Czochralski (CZ) method, and more particularly preventing as-grown defects created in order to obtain high-quality single-crystal silicon.

The above-mentioned apparatus includes a first thermal shield member surrounding the pulling single-crystal silicon and a second thermal shield member inside the first thermal shield member, surrounding the pulling single-crystal silicon. The second thermal shield member is fixed on the first thermal shield member by a support located on the external surface of the second thermal shield member and connected to the first thermal shield member. The surroundings of a solid-liquid interface are extremely cooled by using the first thermal shield member, thereby a stable shape of the single-crystal silicon is formed. The temperature gradient of the temperature region of 1000° C.~1200° C. where the single-crystal silicon passes is decreased by using the second thermal shield member so as to reduce the crystal defect density, thereby obtaining single-crystal silicon having a stronger oxide film voltage breakdown characteristic. If the support length is changed, the second thermal shield member can be adjusted in the upper or lower direction in order to make the expected portion of single-crystal silicon cool slowly.

20 Claims, 5 Drawing Sheets

APPARATUS FOR FABRICATING SINGLE-CRYSTAL SILICON

BACKGROUND OF THE INVENTION

1. Field of the invention

The invention relates to an apparatus for fabricating single-crystal silicon, and more particularly to an apparatus for fabricating single-crystal silicon based on the Czochralski method.

2. Description of the Prior Art

High pure single-crystal silicon is mainly used as substrates in semiconductor fabricating. Generally, a method for fabricating single-crystal silicon is based on the Czochralski (hereinafter referred to as "CZ"). As shown in FIG. 8, lumpy poly-silicon materials are fed into a quartz crucible 4 disposed inside the main chamber 1 of an apparatus for fabricating single-crystal silicon. The lumpy poly-silicon materials are melted into a melt 5 by a loop heater 6 surrounding a graphite crucible 3 in which the quartz crucible 4 is disposed. Furthermore, disposing a seed on a seed holder 21, the seed holder 21 and graphite crucible 3 rotate in the same direction or in different directions. Meanwhile the seed holder 21 is pulled up to grow single-crystal silicon 12 on the seed.

A thermal shield member 22 made of graphite and closely extending to the melt 5 is located on the top of the main chamber 1. The above-mentioned thermal shield member 22 is used to control the flow rate of an inert gas led into from the top of the main chamber 1 and to block radiant heat from the melt 5 and heater 6 in order to cool and provide heat conservation through the whole temperature region along single-crystal silicon 12, thereby easing crystallization and raising the yield of single-crystal silicon.

Referring to FIG. 9, an apparatus for fabricating single-crystal silicon has a thermal shield member 23 of a hollow, inverted truncated conical shape with openings at both ends. The above-mentioned thermal shield member 23 installed on the top of a heat conservation member 7 by means of a support 24 leads an inert gas into the surroundings of single-crystal silicon 12 to form a current flowing from the center of the quartz crucible 4 to the bottom of the main chamber 1 via internal edges, thereby exhausting silicon dioxide ($SiO_2$) created by a melt 5 and metal vapor created by a graphite crucible 3, blocking a single crystallization gas in order to raise crystallization rate without dislocation, and increasing the temperature gradient in diameter and axis directions of single-crystal silicon on the solid-liquid interface so as to enhance pulling stability.

The radiation heat which is emitted from hot zone parts including a main heater to the pulling single-crystal silicon is blocked by a thermal shield member as shown in FIG. 8 or FIG. 9. Since the temperature gradient in diameter and axis directions on the solid-liquid interface is increased, crystallization is easy, thereby enhancing the pulling speed for single-crystal silicon and raising productivity. However, by using the thermal shield member to make the whole temperature region in the axis direction of the single-crystal silicon extremely cool resulting in a temperature gradient of 20° C.~30° C./cm causes two problems as follows:

(1) When the pulling single-crystal silicon passes the temperature region of 1000° C.~1200° C., since the above-mentioned temperature region is not cooled slowly, as-grown defect density can not be decreased and a low breakdown voltage of an oxide film results.

(2) Since the thermal shield member 22 is fixed on the top of the main chamber 1 and is closely extended to the melt 5, if lumpy poly-silicon materials are fed into the quartz crucible 4, interference between lumpy poly-silicon materials and the bottom of the thermal shield member 22 occurs. Hence, the lowering of quartz crucible 4, which is necessary during the melting lumpy poly-silicon materials requires extra time. Referring to FIG. 9, the thermal shield member 23 having a lift can be raised to the top of the main chamber 1, thus preventing the interference between lumpy poly-silicon materials and the bottom of the thermal shield member 23.

SUMMARY OF THE INVENTION

Based on the above-mentioned problems, the invention is to provide an apparatus for fabricating single-crystal silicon to control the temperature gradient of pulling single-crystal silicon based on the Czochralski (CZ), and in particular to prevent as-grown defects created in order to enhance single-crystal silicon quality.

To attain the above-referred objects, the invention provides an apparatus for fabricating single-crystal silicon based on the CZ method having a first thermal shield member surrounding the pulling single-crystal silicon and a second thermal shield member inside the first thermal shield member also surrounding the pulling single-crystal silicon. Moreover, the second thermal shield member is supported by the first thermal shield member and can be adjusted toward the upper or lower direction.

The temperature gradient of the pulling single-crystal silicon is controlled by using the above-referred combined two thermal shield members in the invention. According to the structure of the combined two thermal shield members, the surroundings of a solid-liquid interface is extremely cooled by means of the first thermal shield member in the shape of a hollow cylinder or a hollow inverted, truncated cone above a melt during pulling single-crystal silicon, thereby executing stable pulling. And the second thermal shield member inside the first thermal shield member, surrounding a specific part of the single-crystal silicon conserves the heat of this specific part. Crystal defect density (such as LSTD and FPD) seriously affecting the breakdown voltage characteristic of an oxide film is reduced by improving the heat history of the pulling single-crystal silicon. Since the above-mentioned defect density depends on a high temperature region, and more particularly on the cooling temperature region of 1180° C.~1050° C., the defect density is reduced by slowing the cooling rate of this temperature region. Hence, if the second thermal shield member is disposed at a position where single-crystal silicon passes the temperature region of 1000° C.~1200° C. with a smaller temperature gradient, the as-grown defect density is reduced.

Moreover, since the second thermal shield member supported by the first thermal shield member is adjustable, the position of the second thermal shield member can be adjusted before fabricating single-crystal silicon to lower the temperature gradient of the above-referred (specific) temperature region, so that single-crystal silicon having a pre-determined heat history is obtained.

DETAILED EMBODIMENTS OF THE INVENTION

Figure 1:
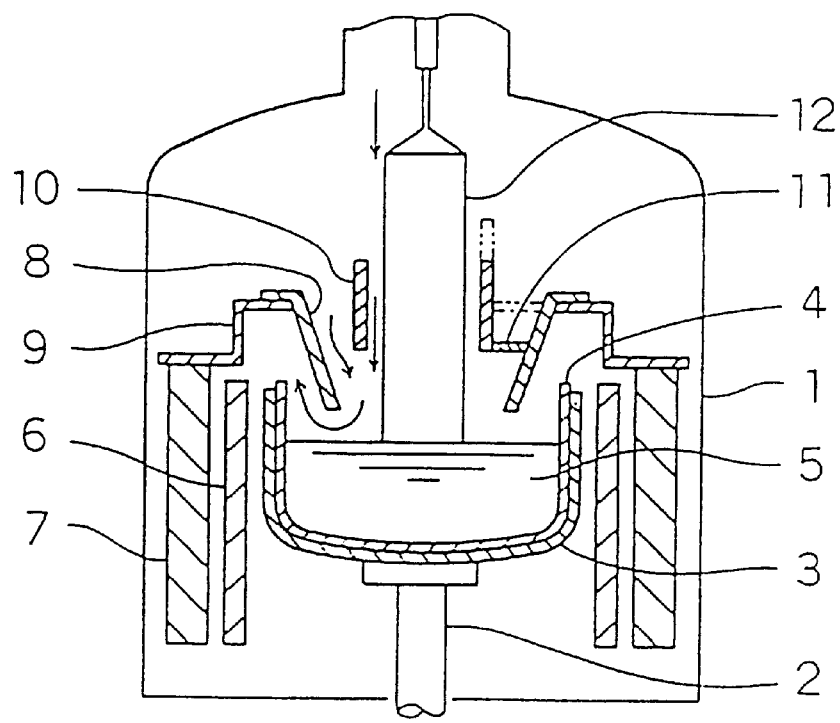
FIG. 1 is a vertical cross-sectional view showing a brief structure of an apparatus for fabricating single-crystal silicon according to a first embodiment of the invention.

An apparatus for fabricating single-crystal silicon according to an embodiment of the invention is illustrated with reference to drawings. Referring to FIG. 1, a vertical cross-sectional view shows the structure of an apparatus for fabricating single-crystal silicon according to a first embodiment of the invention. Inside the main chamber 1, a graphite crucible 3 is disposed on the top of a crucible axis 2 which can rotate and ascend/descend. Then, a poly-silicon melt 5 is stored in a quartz crucible 4 contained by the graphite crucible 3. A loop heater 6 and loop heat conservation member 7 are installed on the surroundings of the graphite crucible 3.

A first thermal shield member 8 in a hollow inverted, truncated cone shape is made of graphite and is set up on the top of the heat conservation member 7 by means of a support 9. Moreover, a second thermal shield member 10 in a hollow cylindrical shape is made of graphite and the surroundings of it is set up with a support 11 which can be dismounted. The above-mentioned support 11 consists of 3 or 4 bars in radial shape toward the axis. The front ends of the support 11 are connected to the internal surface of the first thermal shield member 8, so that the second thermal shield member 10 can be fixed on the first thermal shield member 8. If the support 11 is exchanged with different lengths of above-mentioned bars having a dotted line as shown in FIG. 1, the height of the second thermal shield member 10 with relation to the first thermal member 8 is adjusted. Furthermore, the first thermal shield member 8 as well as the second thermal shield member 10 can be raised to the top of the main chamber 1 by a lift (not shown in FIG. 1). The first thermal shield member 8 can be made of carbon fiber covered with a graphite material and the second thermal shield member 10 can be made of molybdenum steel or stainless steel.

As shown in FIG. 1, an inert gas represented by arrows is led to the top of the main chamber 1 and flows to the surroundings of the pulling single-crystal silicon, the gap between the first thermal shield member 8 and the second thermal shield member 10 and the gap between the second thermal shield member 10 and single-crystal silicon 12, then passing the gap between the first thermal shield member 8 and the melt 5 to finally exit from the bottom of the main chamber 1. The solid-liquid interface of single-crystal silicon 12 is extremely cooled by using the first thermal shield member 8 to form single-crystal silicon 12 having a predetermined diameter, so that a stable pulling is attained. Moreover, since heat conservation for the specific part of single-crystal silicon 12 is conducted by using the second thermal shield member 10 to decrease the temperature gradient of temperature region of 1000° C.~1200° C., the as-grown defect density is reduced.

Figure 2:
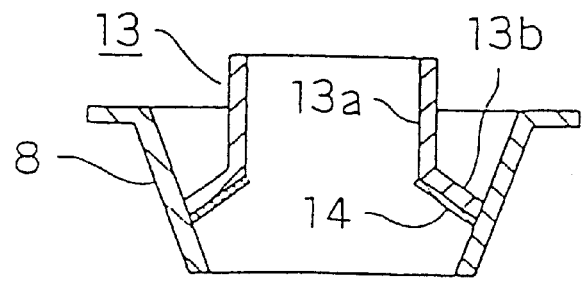
FIG. 2 is a vertical cross-sectional view showing the thermal shield members of an apparatus for fabricating single-crystal silicon according to a second embodiment of the invention.

FIG. 2 is a vertical cross-sectional view showing the thermal shield members of an apparatus for fabricating single-crystal silicon according to a second embodiment of the invention. The first thermal shield member is the same as that of the first embodiment. The second thermal shield member 13 made of graphite consists of a portion 13a in the shape of a hollow cylinder and a portion 13b in the shape of a hollow truncated cone. The portion 13a and the portion 13b are coaxially arranged, and the top end of the portion 13b is connected to the bottom end of the portion 13a. And the internal surface of the portion 13b is set up with a cone-shaped reflection plate 14 made of a molybdenum steel or a stainless steel plate to increase the reflectance to radiation heat. The second thermal shield member 13 is fixed by connecting the bottom of the portion 13b to the internal surface of the first thermal shield member 8. The height of the second thermal shield member 13 with relation to the first thermal shield member 8 is adjustable by varying the bottom diameter of the portion 13b.

During the operation of the apparatus for fabricating single-crystal silicon according to the second embodiment, radiation heat from the melt is reflected to the predetermined part of single-crystal silicon by the reflection plate 14 to enhance heat conservation on the above-referred part. Hence, the temperature gradient of the temperature region of 1000° C.~1200° C. where single-crystal silicon passes is smaller than that in the first embodiment.

Figure 3:
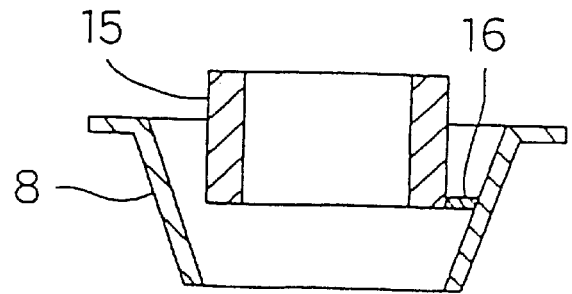
FIG. 3 is a vertical cross-sectional view showing the thermal shield members of an apparatus for fabricating single-crystal silicon according to a third embodiment of the invention.

FIG. 3 is a vertical cross-sectional view showing the thermal shield members of an apparatus for fabricating single-crystal silicon according to a third embodiment of the invention wherein the first thermal shield member 8 is the same as that in the first embodiment. The second thermal shield member 15 in the shape of a hollow cylinder is made of graphite and is thicker than the thermal shield member 10 of the first embodiment in FIG. 1 to enhance heat conservation. The second thermal member 15 is fixed on the internal surface of the first thermal shield member by a support 16.

Figure 4:
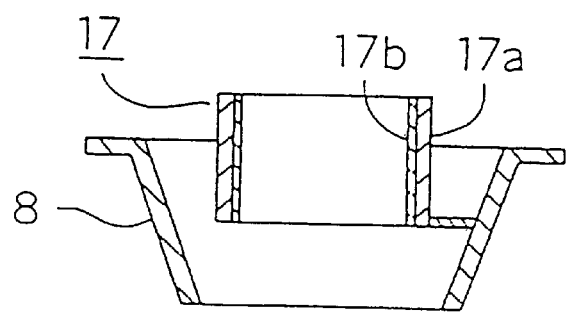
FIG. 4 is a vertical cross-sectional view showing the thermal shield members of an apparatus for fabricating single-crystal silicon according to a fourth embodiment of the invention.

FIG. 4 is a vertical cross-sectional view showing the thermal shield members of an apparatus for fabricating single-crystal silicon according to a fourth embodiment of the invention. The first thermal shield member 8 is the same as that in the first embodiment. The second thermal shield member 17 is of two-layer structure, an outer layer 17a made of graphite and an inner layer 17b made of molybdenum steel or stainless steel wherein the inner layer 17b is fixed on the internal surface of the outer layer 17a. A way to fix the first thermal shield member is the same as that in the first embodiment. In this embodiment, the outer layer 17a conserves heat for a specific part of the single-crystal silicon. The inner layer 17b reflects radiation heat from a melt and the inside of a furnace to single-crystal silicon in order to control the temperature gradient of any temperature regions on the single-crystal silicon.

Figure 5:
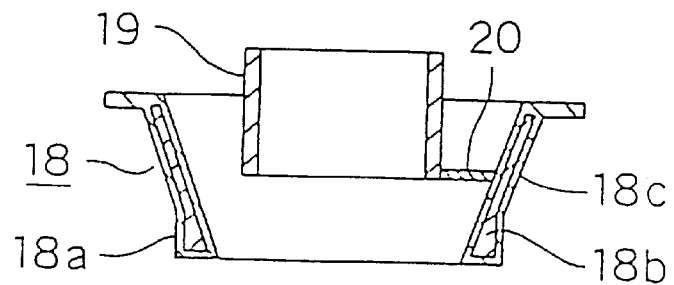
FIG. 5 is a vertical cross-sectional view showing the thermal shield members of an apparatus for fabricating single-crystal silicon according to a fifth embodiment of the invention.

FIG. 5 is a vertical cross-sectional view showing the thermal shield members of an apparatus for fabricating single-crystal silicon according to a fifth embodiment of the invention. The first thermal shield member 18 is fashioned in the shape of an inverted truncated cone with a protrusion portion 18a in a triangular shape. A way to fix the first thermal shield member on the top of a heat conservation member is the same as that in the first embodiment. The second thermal shield member 19 in the shape of a cone made of graphite fixed on the first thermal shield member 18 by using a support 20 which can be dismounted and which is set up on the external surface of the second thermal shield member 19. Since the first thermal shield member 18 has a carbon fiber portion 18b covered by a graphite portion 18c, the above-mentioned protrusion portion 18a further enhances high radiation heat insulation. Hence, pulling single-crystal silicon passing the protrusion portion 18a is extremely cooled to cause a large temperature gradient around the solid-liquid interface of the single-crystal silicon, thereby enhancing the pulling stability.

Any one of apparatus for fabricating single-crystal silicon according to the five above-cited embodiments employs a first thermal shield member to look for a stable shape of single-crystal silicon. Meanwhile, the temperature gradient of the specific temperature region of the single-crystal silicon is controlled by using a second thermal shield member. The order of the slowly cooling effect caused by using a second thermal shield member is listed as follows:

(1) The second embodiment;
(2) The fourth embodiment;
(3) The third embodiment;
(4) The first embodiment; and
(5) The fifth embodiment.

Figure 6:
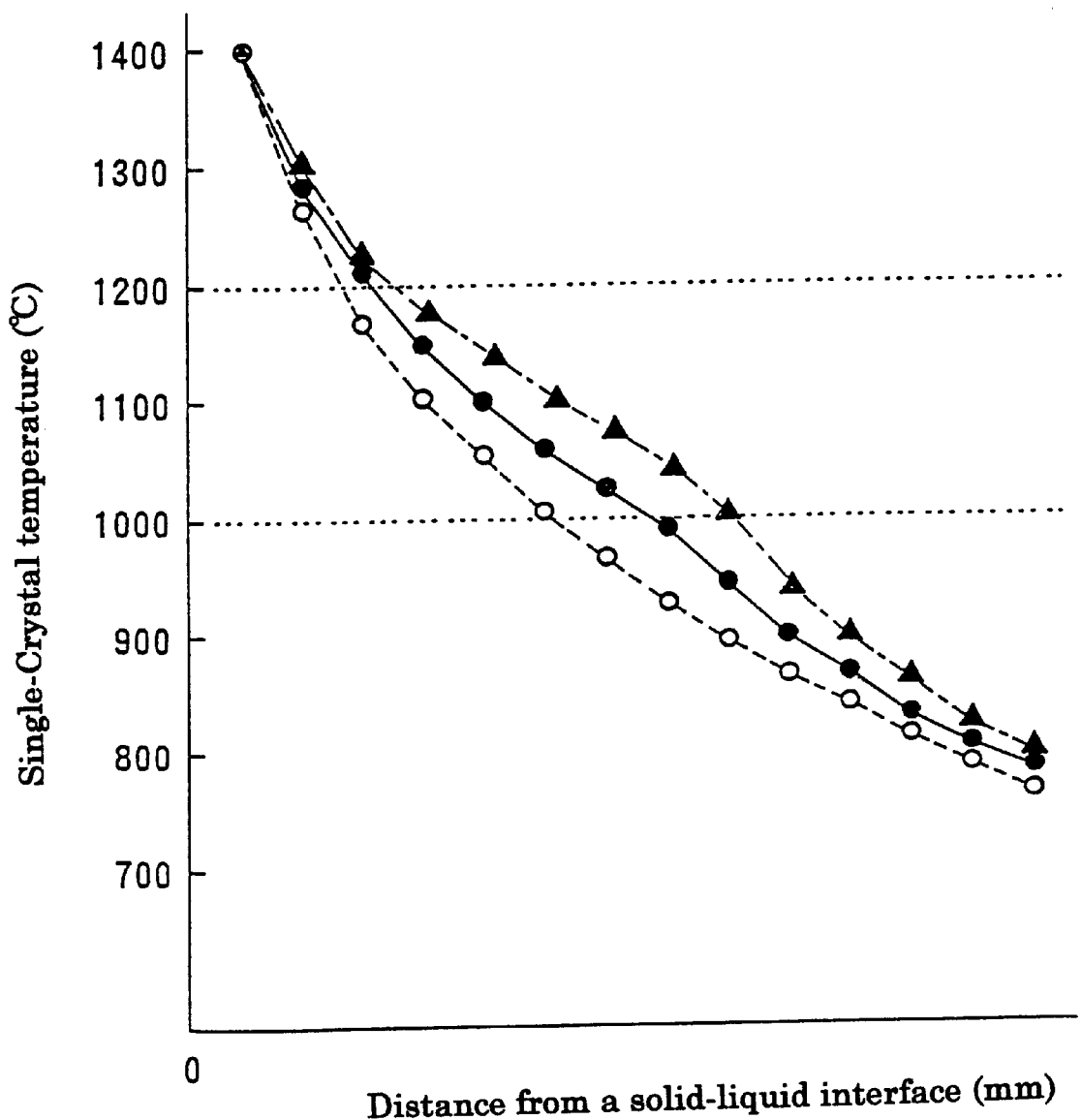
FIG. 6 is a graph showing the relation between distances from a solid-liquid interface to any positions of single-crystal silicon and temperatures on the above-mentioned positions of the single-crystal silicon by using the thermal shield members of the first embodiment and the second embodiment individually to pull single-crystal silicon.

To pull single-crystal silicon by using two apparatuses for fabricating single-crystal silicon according to the second embodiment and first embodiment, respectively, the relation between distances from the solid-liquid interface to any positions of single-crystal silicon and temperatures on any positions of single-crystal silicon is measured at the same time. For comparison with the above-referred second embodiment and first embodiment, a conventional apparatus only having a cone-shaped thermal shield member for fabricating single-crystal silicon is also used for pulling single-crystal silicon in this experiment. The results of this experiment are shown in FIG. 6. In FIG. 6, the temperature gradient of a temperature region of 1000° C.~1200 ° C. through which the pulling single-crystal silicon passes is smallest in the second embodiment (with a mark ▲); the first embodiment (with a mark ●) has a larger temperature gradient; and the conventional apparatus (with a mark ○) has the largest temperature gradient, thereby proving the existence of the slowly cooling effect caused by a second thermal shield member.

Figure 7:
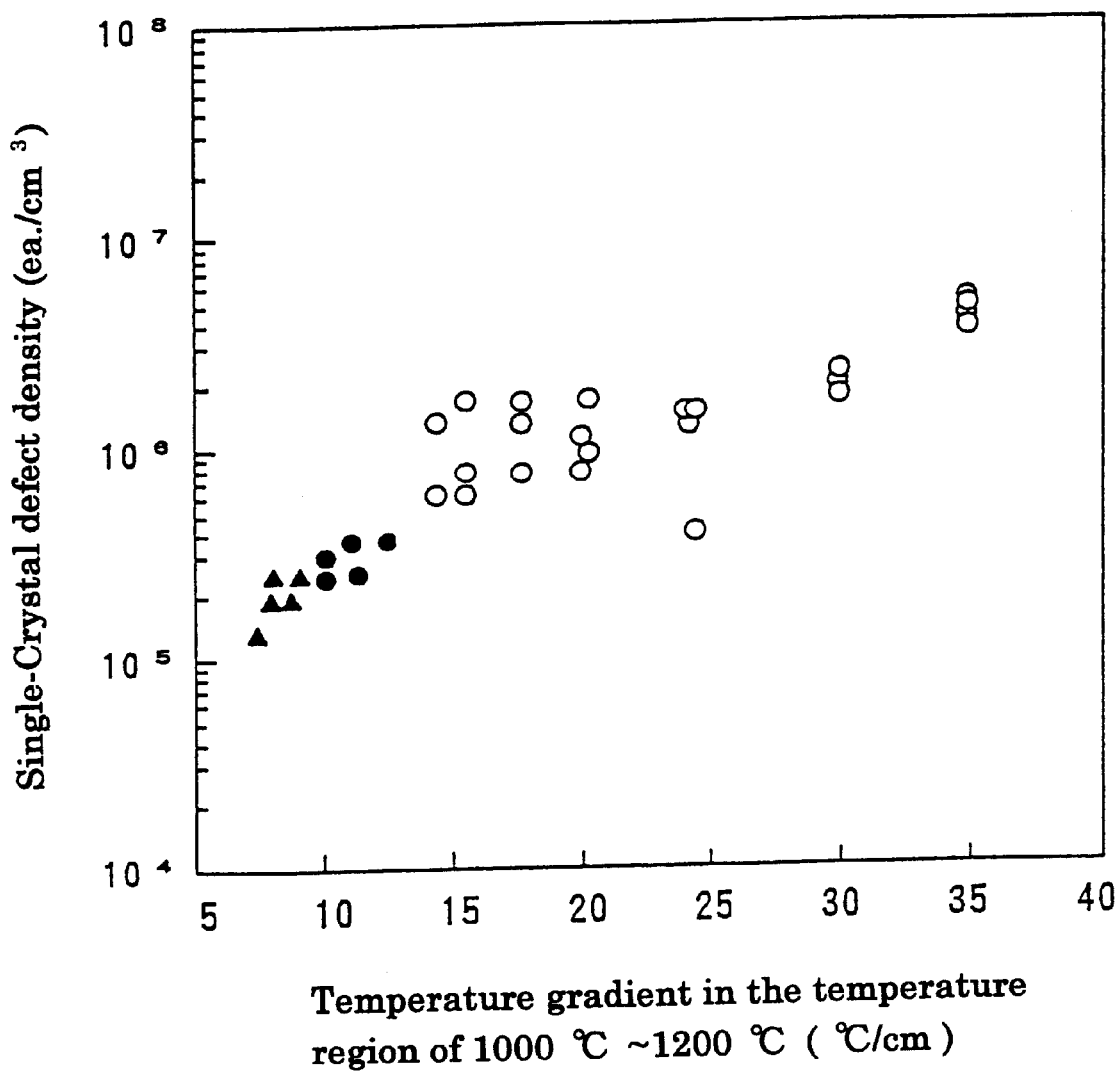
FIG. 7 is a graph showing the relation between the temperature gradients and the defect densities of single-crystal silicon in the temperature region of 1000° C.~1200° C. where growing single-crystal silicon passes.
Figure 8:
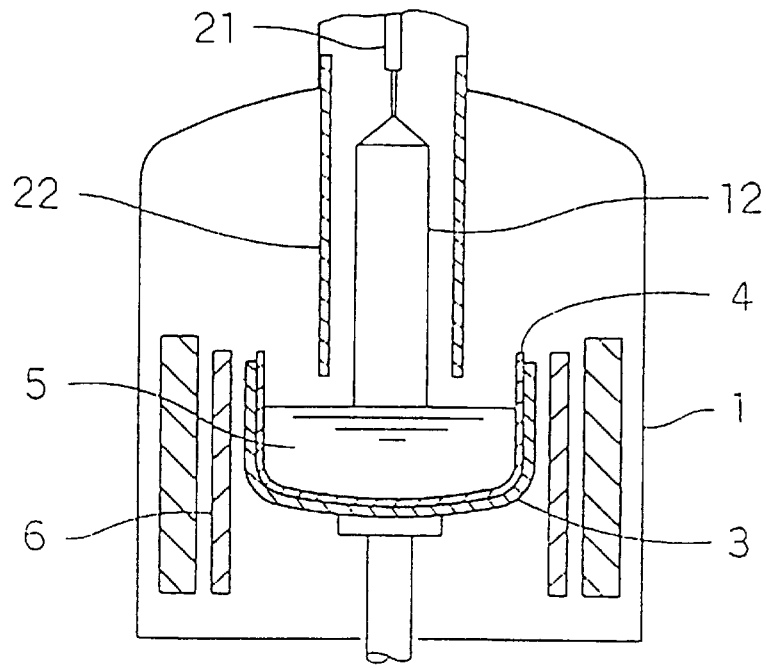
FIG. 8 is a part of a vertical cross-sectional view showing a conventional apparatus for fabricating single-crystal silicon.
Figure 9:
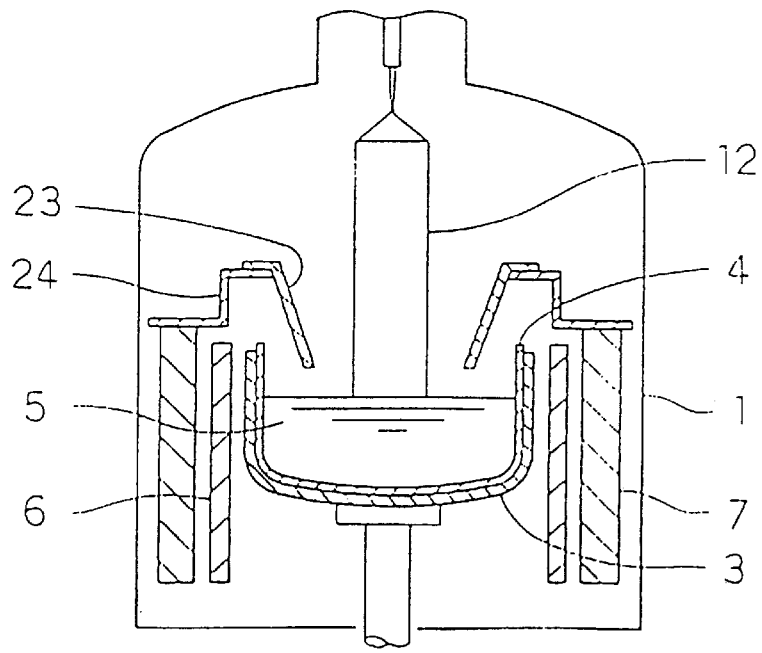
FIG. 9 is a part of a vertical cross-sectional view showing another conventional apparatus for fabricating single-crystal silicon.

FIG. 7 is a graph showing the relation between temperature gradients on the temperature region of 1000° C.~1200° C. where single-crystal silicon passes and defect densities (LSTD). In FIG. 7, the mark ▲ represents the second embodiment; the mark ● represents the first embodiment; and the mark ○ represents the conventional apparatus. The defect density averages of the second embodiment, the first embodiment, the conventional apparatus are $1.9 \times 10^5$ ea./cm$^3$, $3.1 \times 10^5$ ea./cm$^3$, and $1.2 \times 10^6$ ea./cm$^3$, respectively. Therefore, the single-crystal silicon with stronger oxide film voltage breakdown is produced by simultaneously using the first thermal shield member and the second thermal shield member to pull single-crystal silicon.

In the past, a suspended member thermal shield member toward a crucible from the top of a main chamber covering the whole temperature region of the single-crystal silicon provides a cooling or heat conservation function. However, the temperature gradient of the temperature region for only the purpose of pulling single-crystal silicon can be changed by using the thermal shield members of the invention. In particular, the graphite material used for producing a second thermal shield member enhances the heat conservation function in order to complete slow cooling.

When lumpy poly-silicon materials are fed into the quartz crucible during melting, if the first thermal shield member and the second thermal shield member rise to the top of the main chamber simultaneously, the interference between lumpy poly-silicon materials and thermal shield members can be prevented and stable material melting can be attained at a proper position with superior thermal efficiency.

Further, an opening can be set up on the second thermal shield member as a view window to determine the growing situation of the single-crystal silicon.

In an apparatus for fabricating single-crystal silicon based on the CZ method according to the invention, since the combined thermal shield members include a first thermal shield member making the surroundings of the solid-liquid interface of the pulling single-crystal silicon extremely cool and a second thermal shield member making the temperature region of 1000° C.~1200° C. where the single-crystal silicon passes cool slowly, the stable shape of single-crystal silicon is attained by using the first thermal shield member and the as-grown defect density is easily reduced by using the second thermal shield member. An apparatus for fabricating single-crystal silicon with a simple structure according to the invention efficiently improves the heat history of pulling the single-crystal silicon and attains high quality single-crystal silicon having a superior oxide film voltage-breakdown characteristic.

What is claimed is:

1. An apparatus for fabricating single-crystal silicon based on the CZ method, comprising:
   a crucible for holding a melt;
   a pulling means for pulling a single-crystal silicon having a certain temperature gradient from the melt;
   a first fixed conical thermal shield member having an upper end and lower end and surrounding the pulled single-crystal silicon; and
   a second thermal shield member disposed inside the first thermal shield member movable so that a lower end of the second thermal shield member is between the upper end and the lower end of the first thermal shield member along the outer surface of a region of the pulled single-crystal silicon wherein the position of the second thermal shield member is adjustable relative to said first thermal shield member so as to conserve heat of said region of the single crystal silicon and maintain the temperature gradient of the single crystal silicon being pulled up at 1000° C.–1200° C. at a sufficiently small level.

2. An apparatus for fabricating single-crystal silicon based on the CZ method as claimed in claim 1, wherein the second thermal shield member is supported by the first thermal shield member and can be adjusted in the upper and lower directions.

3. An apparatus for fabricating single-crystal silicon based on the CZ method as claimed in claim 1, wherein the first thermal shield member is made of graphite.

4. An apparatus for fabricating single-crystal silicon based on the CZ method as claimed in claim 1, wherein the first thermal shield member is made of carbon fiber covered with a graphite material.

5. An apparatus for fabricating single-crystal silicon based on the CZ method as claimed in claim 1, wherein the first thermal shield member is in a hollow inverted, truncated cone shape.

6. An apparatus for fabricating single-crystal silicon based on the CZ method as claimed in claim 1, wherein the first thermal shield member is in the shape of an inverted truncated cone with a protrusion in a triangular shape.

7. An apparatus for fabricating single-crystal silicon based on the CZ method as claimed in claim 1, wherein the second thermal shield member is made of graphite.

8. An apparatus for fabricating single-crystal silicon based on the CZ method as claimed in claim 1, wherein the second thermal shield member is made of molybdenum steel.

9. An apparatus for fabricating single-crystal silicon based on the CZ method as claimed in claim 1, wherein the second thermal shield member is made of stainless steel.

10. An apparatus for fabricating single-crystal silicon based on the CZ method, as claimed in claim 1 wherein the second hollow shield member is a hollow cylinder disposed so as to have a gap between the single crystal silicon and the inner surface of the cylinder and keep the temperature gradient of the single crystal silicon being pulled up at 1000° C.–1200° C. at a sufficiently small level.

11. An apparatus or fabricating single-crystal silicon based on the CZ method as claimed in claim 1, wherein the second thermal shield member consists of an upper portion in the shape of a hollow cylinder and a lower portion in the shape of a hollow truncated cone, the upper portion and the lower portion being coaxially arranged in which a top end of the lower portion is connected to a bottom end of the upper portion.

12. An apparatus for fabricating single-crystal silicon based on the CZ method as claimed in claim 11, wherein the portion of a hollow truncated cone has an internal surface which is provided a cone shaped reflection plate.

13. An apparatus for fabricating single-crystal silicon based on the CZ method as claimed in claim 12, wherein the reflection plate is made of molybdenum steel.

14. An apparatus for fabricating single-crystal silicon based on the CZ method as claimed in claim 12, wherein the plate is made of stainless steel.

15. An apparatus for fabricating single-crystal silicon based on the CZ method as claimed in claim 1, wherein the second thermal shield member is provided a view window.

16. An apparatus for fabricating single-crystal silicon based on the CZ method, comprising:

a crucible;

a melt in the crucible;

a pulling means for pulling a single-crystal silicon from the melt;

a first thermal shield member surrounding the pulling single-crystal silicon; and a second thermal shield member inside the first thermal shield member and surrounding the pulling single-crystal, said second thermal shield member having a two-layer structure, an outer layer of graphite and an inner layer of molybdenum steel.

17. An apparatus for fabricating single-crystal silicon based on the CZ method, comprising:

a crucible;

a melt in the crucible;

a pulling means for pulling a single-crystal silicon from the melt;

a first thermal shield member surrounding the pulling single-crystal silicon; and a second thermal shield member inside the first thermal shield member and surrounding the pulling single-crystal, said second thermal shield member being a two-layer structure, an outer layer of graphite and an inner layer of stainless steel.

18. The apparatus for fabricating single crystal silicon as claimed in claim 1, wherein the second thermal shield member is moveable between the upper end and the lower end of the first thermal shield member along the single crystal silicon and surrounding the region of the single crystal silicon so as to maintain the temperature gradient of the single crystal at 1150° C.–1080° C. at a sufficiently small level.

19. The apparatus for fabricating single crystal silicon as claimed in claim 1, herein the lower end of the second thermal shield member may be movably secured to the inner part of the first heat thermal shield member so as to maintain the temperature gradient of the single crystal at 1150–1080° C. at a sufficiently small level.

20. An apparatus for fabricating single-crystal silicon based on the CZ method, comprising:

a crucible for holding a melt;

a pulling means for pulling a single-crystal silicon having a certain temperature gradient from the melt, a first fixed conical thermal shield member surrounding the pulled single-crystal silicon; and a second thermal shield member disposed inside the first thermal shield member and movable so that the second thermal shield member and the first thermal shield member have an overlapping portion at a point of heat conservation of the single crystal silicon along the outer surface of a region of the and surrounding the pulled single-crystal silicon wherein the position of the second thermal shield member is adjustable relative to said first thermal shield member so as to conserve heat at said point of the single crystal silicon and maintain the temperature gradient of the single crystal silicon being pulled up at 1000° C.–1200° C. at a sufficiently small level.

* * * * *